US00RE35261E

United States Patent [19]

Nelson

[11] E Patent Number: Re. 35,261

[45] Reissued Date of Patent: Jun. 4, 1996

[54] DIFFERENTIAL INPUT AMPLIFIER STAGE WITH FREQUENCY COMPENSATION

[75] Inventor: Carl T. Nelson, San Jose, Calif.

[73] Assignee: Linear Technology Corporation, Milpitas, Calif.

[21] Appl. No.: 355,080

[22] Filed: Dec. 12, 1994

Related U.S. Patent Documents

Reissue of:

[64] Patent No.: 5,182,526
Issued: Jan. 26, 1993
Appl. No.: 732,039
Filed: Jul. 18, 1991

[51] Int. Cl.[6] ..... H03F 3/45

[52] U.S. Cl. ..... 330/257; 323/280; 323/316

[58] Field of Search ..... 330/257; 323/265, 323/273, 280, 315, 316

[56] References Cited

U.S. PATENT DOCUMENTS

| | | | |
|---|---|---|---|
| 3,735,240 | 5/1973 | Davis et al. | 323/280 |
| 4,341,990 | 7/1982 | Davis | 323/303 |
| 4,413,226 | 11/1983 | Davies | 323/316 X |

OTHER PUBLICATIONS

Data Sheet, "LM120 Series 3-Terminal Negative Regulators," National Semiconductor Corporation 1982 Linear Databook, pp. 1-39 to 1-46.

Data Sheet, "LM747/LM741A/LM41C/LM741E Operational Amplifier," National Semiconductor Corporation 1982 Linear Databook, pp. 3-257 to 3-259.

Data Sheet, "LM101A/LM301A/LM107/LM307 Operational Amplifiers," Linear Technology Corporation 1986 Linear Databook, pp. 2-177 to 2-182.

James E. Solomon, "The Monolithic Op Amp: A Tutorial Study," *IEEE Journal of Solid-State Circuits*, pp. 314-332, vol. SC-9, No. 6, Dec. 1974.

*Primary Examiner*—James B. Mullins
*Attorney, Agent, or Firm*—Fish & Neave; Mark D. Rowland; Robert W. Morris

[57] ABSTRACT

A differential input amplifier stage having improved frequency compensation. Frequency compensation is achieved by cancelling one-half of the signal output of a differential error amplifier in the input stage, such that all error signals must pass through a "current-mirror" type load circuit in which a resistor-capacitor network is provided to roll of gain of the input stage.

11 Claims, 3 Drawing Sheets

FIG. 2 REVISED

DIFFERENTIAL INPUT AMPLIFIER STAGE WITH FREQUENCY COMPENSATION

Matter enclosed in heavy brackets [ ] appears in the original patent but forms no part of this reissue specification; matter printed in italics indicates the additions made by reissue.

BACKGROUND OF THE INVENTION

The present invention realtes to improved frequency compensation for analog integrated circuits, especially integrated circuit devices used in implementing voltage regulator circuits and other negative feedback circuits requiring ripple rejection.

As is well known, the basic architecture of a series-type voltage regulator circuit includes a pass element (e.g., a transistor) connected in series between a load and an unregulated supply line, an error amplifier which controls the pass element, a voltage reference generator connected to one input of the error amplifer and a negative feedback network connected between the other input of the error amplifier and the output of the regulator circuit. This type of architecture has been incorporated in many commercially available integrated circuits.

Most applications of a boltage regulator circuit require the circuit to be stable. Like any other circuit operating with negative feedback, a series-type voltage regulator circuit will tend to become unstable (i.e. break into oscillations) if total phase shift across the circuit for a particular frequency approaches 180° and, simultaneously, the magnitude of the gain of the circuit at that frequency approaches unity. In an idealized voltage regulator circuit, stability is not a problem because total phase shift is limited to 90° and overall gain exhibits a signale-pole rolloff characteristic corresponding to a −6 dB/octave rolloff of dc open-loop gain for frequencies in excess of a relatively low 3-dB bandwidth $w_0$.

However, as a result of excess phase shifts associated with active devices and stray capacitances inherent in practical voltage regulator circuits, total phase shift across such circuits typically exceeds 180° at frequencies well within a desired range of operation. Therefore, it is usually necessary to compensate practical regulator circuits to provide stable operation. Such compensation is typically requried in operational amplifier circuits as well.

Commonly, capacitors are placed in voltage regulator and operational amplifier circuits to provide frequency compensation. However, the integration of a voltage regulator or operational amplifier circuit complicates such frequency compensation by limiting the points that an external capacitor can be connected, and by imposing size constraints on internal capacitors.

One known frequency compensation technique associated with integrated circuit voltage regulator devices is to use an internal capacitor to reduce the gain of the differential input amplifier stage of the regulator at high frequencies. This technique is used, for example, in the LM120 integrated circuit negative voltage regulator device available commercially from various manufactures. The differential input amplifier stage of the LM120 includes a differential amplifier coupled to a current mirror load. The current mirror load acts as a gain stage, and performs differential-to-single-ended signal conversion. The gain of the differential input amplifier stage is rolled off by coupling a bypass capacitor across the base-collector junction of the output transistor of the current mirror load. This approach. however, has shortcomings and disadvantages that limit the operating characteristics of the circuit.

For example, even with the internal capacitor, a differential input amplifier stage of the type in the LM120, which has npn-pnp composite transistors at its inputs, exhibits a gain of at least 0.25, no matter what the value of the internal capacitor is. In standard circuits that have a single transistor at each input instead of a composite like the LM120, this minimum gain is typically 0.5. Because the outpu stage of the device also introduces gain into the regulator system looop, unstable circuit conditions may still result. Also, regulator circuits, especially when used in power supplies, typically include an external capacitor coupled across the load to absorb transients. The external capacitor introduces a pole into the regulator system loop that, when combined with the pole created by the internal capacitor, can cause excess phase shift tending to exacerbate stability problems.

In most operational amplifier circuits, the voltage gain of the input stage can be rolled-off by placing an internal of external capacitor across the output stage, thus providing simple frequency compensation. However, the capacitor tends to pass signals at the amplifier supply line directly to the ouptut. In a regulator circuit having a rectified ac voltage signal at is input, the capacitor would create ripple in the output voltage. This compensation technique therefore is not suitable for regulator circuits, or even for some operational amplifier circuits, where it is desired that th ecircuit have an ability to reject fluctuations of voltage signals on the power supply lines (i.e. ripple rejection).

It would therefore be desirable to be able to provide a differential input amplifier stage for a voltage regulator or other circuit that does not require a large capacitor for frequency compensation, and that therefore can be implemented as part of an integrated circuit. It would also be desirable to be able to provide a differential input amplifier stage that cen be compensated without degrading ripple rejection. Further, it would be desirable to be able to provide a differential input amplifier stage having a gain that cen be rolled substantially below 0.25 (for a composite npn-pnp type input) or 0.5 (for a single transistor type input) over some range of frequencies and that can be compensated without causing stability problems when load conditions introduce an external pole approaching a 90° phase shift.

SUMMARY OF THE INVENTION

In view of the foregoing, it is an object of the present invention to provide a differential input amplifier stage that can be implemented in an integrated circuit without neef for a large value internal capacitor.

It is another object of the present invention to provide a differential input amplifier stage with a frequency compensation circuit that can be implemented in a voltage regulator circuit without degrading ripple rejection.

It is yet another object of the present invention to provide a differential input amplifier stage whose gain can be rolled-off over a range of frequencies to substantially less than the minimum gain of a conventional stage having the same type of differential error amplifier design.

It is a further object of the present invention to provide a differential input amplifier stage whose gain can be rolled-off independent of phase shift requirements.

These and other objects and advantages of the present invention are accomplished by cancelling one-half of the signal output of the differential error amplifier in the input stage of the voltage regulator or operational amplifier, such that a single-ended error signal is injected into a first transistor of a "current-mirror" type load circuit. The injected signal causes a voltage change across the first transistor, which signal is in turn fed into a resitor-capacitor integrator network. Component values in the integrator network can be chosen to cause gain of the error amplifier to be rolled-off over a range of frequencies to a value well below the minimum gain of a conventional amplifier of similar type, while simultaneously making excess phase shift build-up negligible over a wide range of load conditions.

In a preferred embodiment, the signal cancellation is effected by spliting the collectors of transistors in the error amplifier to combine currents havign offsetting differential signals at one differential output of the error amplifier. In an alterantive embodiment, cancellation is achieved by shunting one differential output current of the error amplfier to a point which as negligible influence on loop gain and replacing the shunted output current with current from a DC current source.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
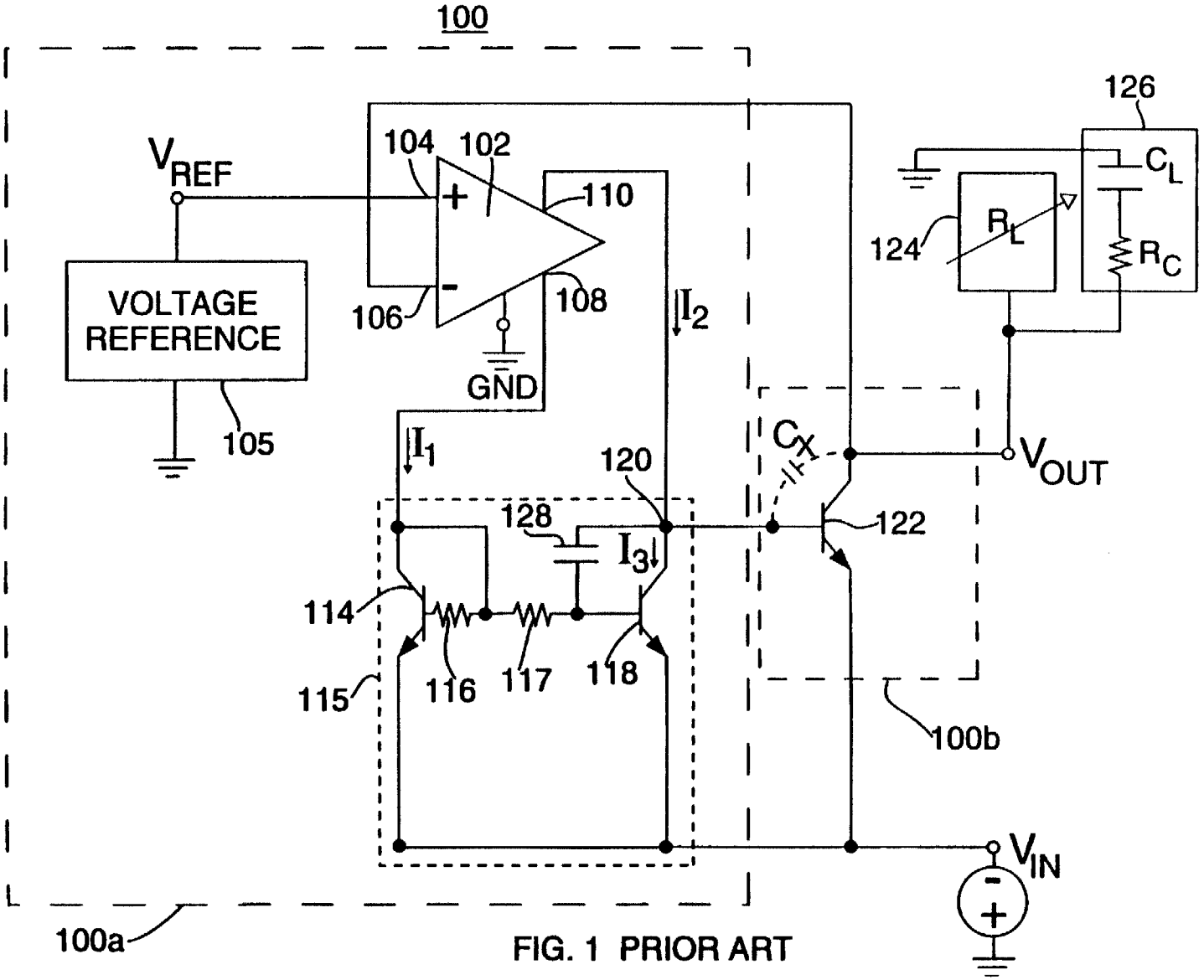
FIG. 1 PRIOR ART
FIG. 1 is a simplified schematic diagram of a conventional voltage regulator circuit.

Referring to FIG. 1, a simplified schematic of a conventional voltage regulator circuit 100 is shown. Regulator circuit 100 includes differential input amplifier stage 100a (hereafter referred to simply as "input stage 100a") and output stage 100b. Input stage 100a includes differential error amplifier 102 having a non-inverting input 104 connected to a voltage reference generator 105, and inverting input 106 connected to receive a feedback voltage from output terminal $V_{OUT}$, and first and second differetnial outpus 108 and 110. Voltage reference generator 105 generates a reference voltage level $V_{REF}$, which is independent of an unregulated supply voltage applied to input terminal $V_{IN}$. Error amplifier 102 compares $V_{REF}$ with the feedback voltage and generates differential, corrective error signals to modulate currents $I_1$ and $I_2$ at outputs 108 and 110 respectively. Each current is modulated to carry one-half of the error signal output of the amplifier.

A current mirror circuit 115, including matching npn transistors 114 and 118, is connected to outputs 108 and 110 to provide active loads for the error amplifier and to perform differential-to-single-ended conversion of the error signals imposed on currents $I_1$ and $I_2$. Current $I_1$ is fed to transistor 114, which sets the base-emitter voltage of transistor 118. Assuming transistors 114 and 118 have the same emitter areas, and ignoring the effects of resistors 116 and 117 and capacitor 128, transistor 118 will conduct a collector current $I_3$ equal to current $I_1$. The collector current of transitor 118 subtracts from current $I_2$ at node 120 to provide an error signal current to the base of output stage transistor 122. This error signal current has a signal component contributed in part by the error signal imposed on current $I_1$, and in part by the error signal imposed of current $I_2$.

The collector of output stage transistor 122 (which represents the gain of output stage 100b in simplified form) is connected to the regulator output terminal $V_{OUT}$, to which a typical output load, represented by a variable resitor 124 having a resistance value $R_L$ connected in parallel with a load capacitor 126 having capacitance $C_L$ and parasitic series resistance $R_C$, is shown connected. Output stage transistor 122, responsive to the current applied to its base, regulates the voltage across the output load to maintain the voltage equal to the voltage reference level $V_{REF}$. In many regulator circuits, the feedback signal provided to the error amplifier is generated by scaling the output voltage, such that the regulator will maintain the output voltage at a level proportional to $V_{REF}$.

In the aforementioned LM120 integrated circuit voltage regulator device, which has a basic architecture of the type represented by stages 100a and 100b of FIG. 1, internal frequency compensation was provided by coupling a small capacitor across the base-collector junction of the output transistor of the input stage current mirror load circuit, as shown for example by capacitor 128 coupled across transistor 118. Capacitor 128 adds a pole to the closed-loop frequency response of regulator circuit 100 at a frequency determined by its capacitance, meaning that at frequencies above the pole the capacitor adds—6 dB/octave of gain rolloff to input stage 100a. The added gain rolloff reduces the unity gain bandwidth of the regulator circuit, and thus improves stability.

Although it would be desirable, from a stability perspective, to choose a large capacitance for capacitor 128 such that the capacitor pole is at a low frequency, this is not practical in an integrated circuit because of the chip area that would be required for the capacitor. However, by adding a resistor 117 between the bases of transistors 114 and 118, as was done in the LM120, a resistor-capacitor integrator network is formed having a pole at a frequency substantially lower than could practically be obtained by capacitor 128 alone. The addition of resistor 117 creates a dc current imbalance in the current mirror. To compensate, a resistor 116 matching the resistance value of resistor 117 is connected between the base and collector of transistor 114.

The integrator network of resistor 117 and capacitor 128 has two disadvantages. First, the gain of input stage 100a cannot be rolled down below a certain minimum gain that typically falls within a range of 0.25–0.5. To explain this, consider error amplifier 102 as comprising a pair of differentially-connected pnp transistors, with the collector of one pnp transistor providing error amplifier output 108 and the collector of the other pnp transistor providing error amplifier output 110. The gain of input stage 100a for error signals at error amplifier output 110 is approximately equal to the output impedance of the current mirror load transistor 118 divided by the emitter impedance of the error amplifier. In this case, the emitter impedance of the error amplifier is equal to twice the emitter resistance of the pnp transistor conducting current $I_2$. At frequencies where the capacitor effectively becomes a short, capacitor 128 causes transistor 118 to appear to the error amplifier as a diode, with an impedance equal to the emitter resistance of the error amplifier transistors. Thus, the ratio of the load impedance and error amplifier emitter impedance is equal to 0.5 and the gain of the stage is 0.5. This is true even assuming that resistor-117 and capacitor 128 are chosen to be of sufficient value to severely attenuate high frequency gain of error amplifier output 108, because the error signal path from output 110 still has a gain of 0.5. If, as in some error amplified designs, each differentially-connected pnp transistor is replaced by an npn-pnp composite transistor, the minimum gain can be reduced to 0.25.

A gain of 0.25–0.5 in input stage 100a, when combined with the gain of output stage 106b, creates an overall loop gain that can exceed unity and destabilize the regulator circuit. In operational amplifier circuits, it is known to provide a capacitor across a second gain stage to add rolloff, as shown for example by capacitor $C_x$ in FIG. 1. However, in regulator circuit 100, such a capacitor would not be suitable because, at higher frequencies, the capacitor would pass signals at terminal $V_{IN}$ directly to the output terminal $V_{OUT}$. This would significantly degrade the circuit's ability to reject ripple on the unregulated input voltage applied to terminal $V_{IN}$.

A second disadvantage of the frequency compensation scheme of FIG. 1 is that the pole created by capacitor 128 will, when combined with a pole created by external load capacitor 126, cause excess phase shift to build up in the closed-loop response of the regulator. Such build-up can be reduced by placing a resistor in series with capacitor 128 between the base and collector of transistor 118, but this then compromises the capacitor's ability to provide gain rolloff.

The present invention overcomes the above disadvantages by cancelling the error signal in the differential current output of the error amplifier coupled directly to the output node of the input stage, thus forcing the entire error signal to pass through the current mirror load circuit of the input stage.

Figure 2:
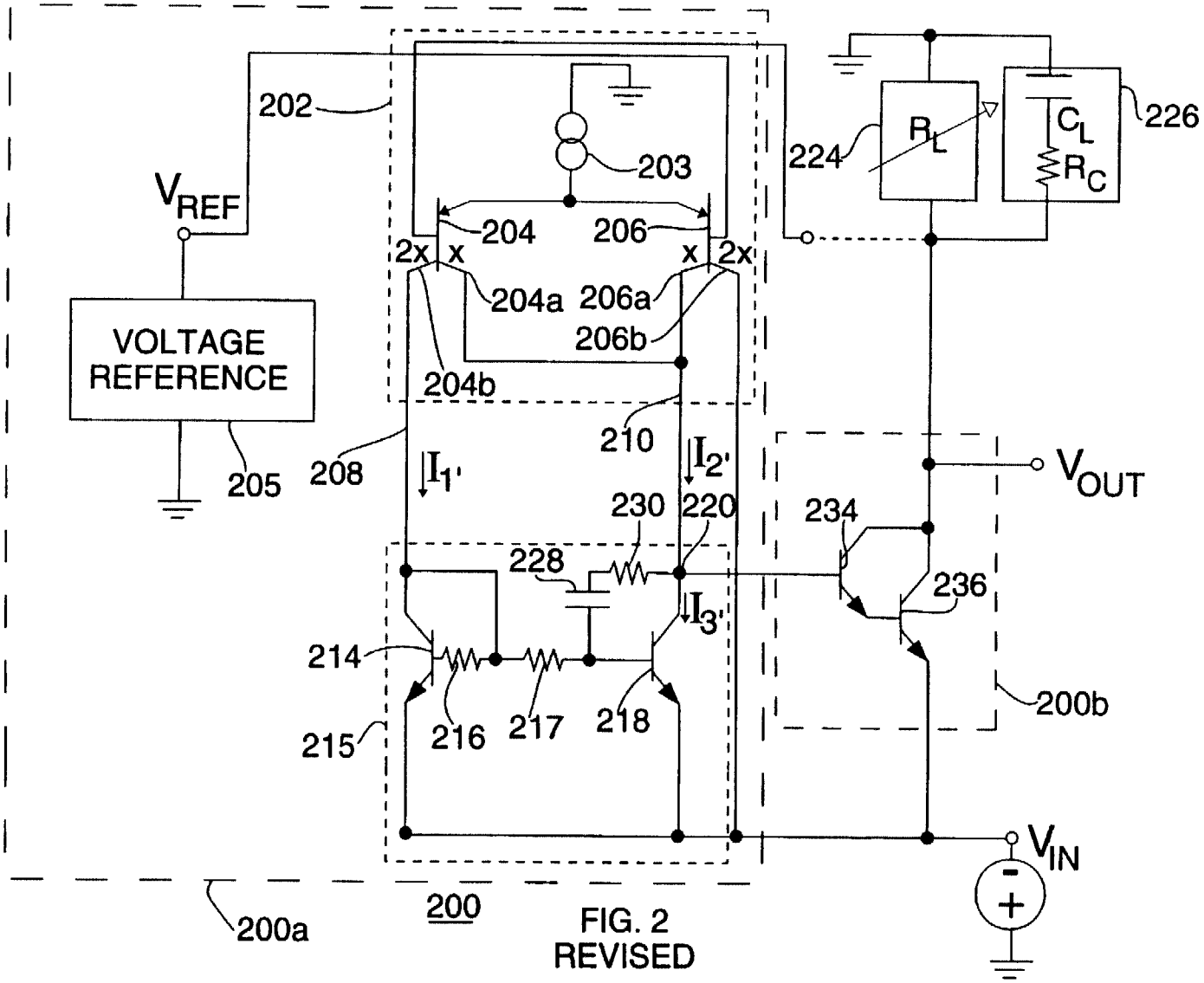
FIG. 2 is a simplified schematic of a voltage regulator circuit utilizing a preferred embodiment of the present invention.

Regulator circuit 200 of FIG. 2 represents a simplified schematic of a preferred embodiment of the present invention. Regulator circuit 200 includes a differential input amplifier stage 200a (hereafter "input stage 200a") and a second gain stage 200b. Input stage 200a includes error amplifier 202 comprising a tail current source 203 and a pair of differentially-connected pnp transistors 204 and 206. Tail current source 203 may be implemented in a conventional manner or may simply be a resistor. The base of transistor [204] *206* is the non-inverting input of error amplifier 202, and is connected to voltage reference generator 205 which generates a reference voltage level $V_{REF}$. The base of transistor [206] *204* is the inverting input of error amplifier 202, and is connected to receive a feedback signal indicative of the voltage at output terminal $V_{OUT}$. The connection between terminal $V_{OUT}$ and the base of transistor [206] *204* is shown by a broken line to indicate that circuitry such as a resistor divider network may be interposed to scale the output voltage.

Each of transistors 204 and 206 has a pair of split collectors, 204a–b and 206a–b, respectively. The areas of the split collectors are ratioed as follows: collectors 204a and [206b] *206a* have equal areas of x, and collectors 204b and 206b have equal areas of 2x. Collector 204b forms a first output 208 of error amplifier 202. Collectors 204a and [206b] *206a* are connected together to form a second output 210 of error amplifier 202. Collector 206b is connected to a point which has negligible influence on loop gain, such as terminal $V_{IN}$ (as shown in FIG. 2). The area ratios of the split collectors are chosen such that the zero-differential signal components of output currents I1' and I2' of the error amplifier are balanced, and equal but out of phase differential signal components are combined at error amplifier output 210 to cancel the error signal at that output.

Error amplifier outputs 208 and 210 are connected to current mirror circuit 215, which includes diode-connected npn transistor 214 and matching npn transistor 218. Transistors 214 and 218 operate as active loads for error amplifier outputs 208 and 210, respectively. In response to a voltage differential appearing across the inputs of transistors 204 and 206 of error amplifier 202, error amplifier 202 modulates current I1' with a single-ended error signal proportional to the input error signal voltage. The impedance of diode-connected transistor 214 converts the single-ended error signal into a voltage that sets the base-emitter voltage of transistor 218, and causes transistor 218 to conduct a current I3', which is subtracted at node 220 from error amplifier output current I2'. The resulting error signal is provided to gain stage 200b comprising npn transistors 234 and 236. Current I2' has no differential signal component because the opposite phase signals appearing at collectors 204a and [206b] *206a* cancel one another. Thus, the error signal gain of input stage 200a is determined by the gain through current mirror circuit 215.

Although a mismatch between the collector currents combined at error amplifier output 210 can result in a signal being conducted by current I2', this signal will be relatively small for most cases and therefore normally will not have enough gain to cause a problem. For example, even if the mismatch is as large as 10%, the gain of error amplifier output [110] *210* will have been reduced approximately by a factor of 10. This reduction in gain will still allow the overall gain of input stage 200a to be rolled well below 0.5. Thus, the collector area ratio of collectors 204a and 206a need not be exactly one-to-one. Any area ratio that results in substantial signal cancellation at output [110] *210* can suffice.

The higher frequency gain through current mirror circuit 215 is controlled by the integrator network formed by resistor 217, connected between the bases of transistors 214 and 218, and capacitor 228 and resistor 230, connected in series with one another between the base and collector of transistor 218. Preferably, a resistor 216 of equal value to resistor 217 is provided at the base of diode-connected transistor 214 to balance DC currents within the current mirror. The values of resistor 217 and capacitor 228 can be chosen to roll off the gain of the error signal path to well below 0.5. Because no signal is carried by current I2', the overall gain of input stage 200a can be rolled-off considerably below 0.5 thus overcoming the first-mentioned disadvantage of the frequency compensation scheme of FIG. 1.

However, as previously discussed, excess phase shift across the regulator must be considered simultaneously with gain. This phase shift may vary widely depending on the nature of the load connected to regulator output terminal $V_{OUT}$. For example, assuming a load consisting of a variable resistor 224 in parallel with a load capacitor 226—a typical load for a regulator circuit—the capacitance in the load will create a pole in the closed-loop response of the regulator. Where load capacitance $C_L$ is large (as is often the case in regulator circuit applications), the pole will be created at a relatively low frequency. This pole may superimpose on the phase response of the regulator a phase shift approaching 90° over a wide range of frequencies, especially if load resistance $R_L$ is light. If the phase shift induced by the load capacitor 226 overlaps to a large extent with that created by capacitor 228, a destabilizing build-up of excess phase shift may result at an undesirably low frequency.

To mitigate the degree of overlap, and thus to reduce the build-up of excess phase shift, capacitor 228 should be prevented from rolling off the gain of input stage 200a too far below 0.5. This is accomplished by placing resistor 230 in series with capacitor 228. Resistor 230 creates a system zero that stops the rolloff of gain due to capacitor 228. In the frequency compensation scheme of FIG. 1, this result could not be achieved without increasing the minimum gain of the input stage. Thus, phase and gain considerations had to be offset. This disadvantage is overcome by the circuit of FIG. 2, where gain can be reduced below 0.5 independent of phase shift requirements.

The present invention has a broad range of applications, and can be used in various regulator and operational circuit designs. The optimum values of resistors 217 and 230, and of capacitor 228, are dependent on the particular design of the circuit, as well as the particular parameters of other devices in the circuit and the range of expected load conditions. Selection of optimum values for a particular application is well within the ordinary skill of a person in the art of analog circuit design, and can be done empirically. Desirable results in typical circuits and applications should be achievable using values for resistors 217 and 230 and capacitor 228 in the approximate ranges of 1–200K ohms, 0.1–10K ohms, and 1–100pF, respectively. Thus, capacitor 228 can be made sufficiently small to allow it to be economically incorporated in an integrated circuit device.

Figure 3:
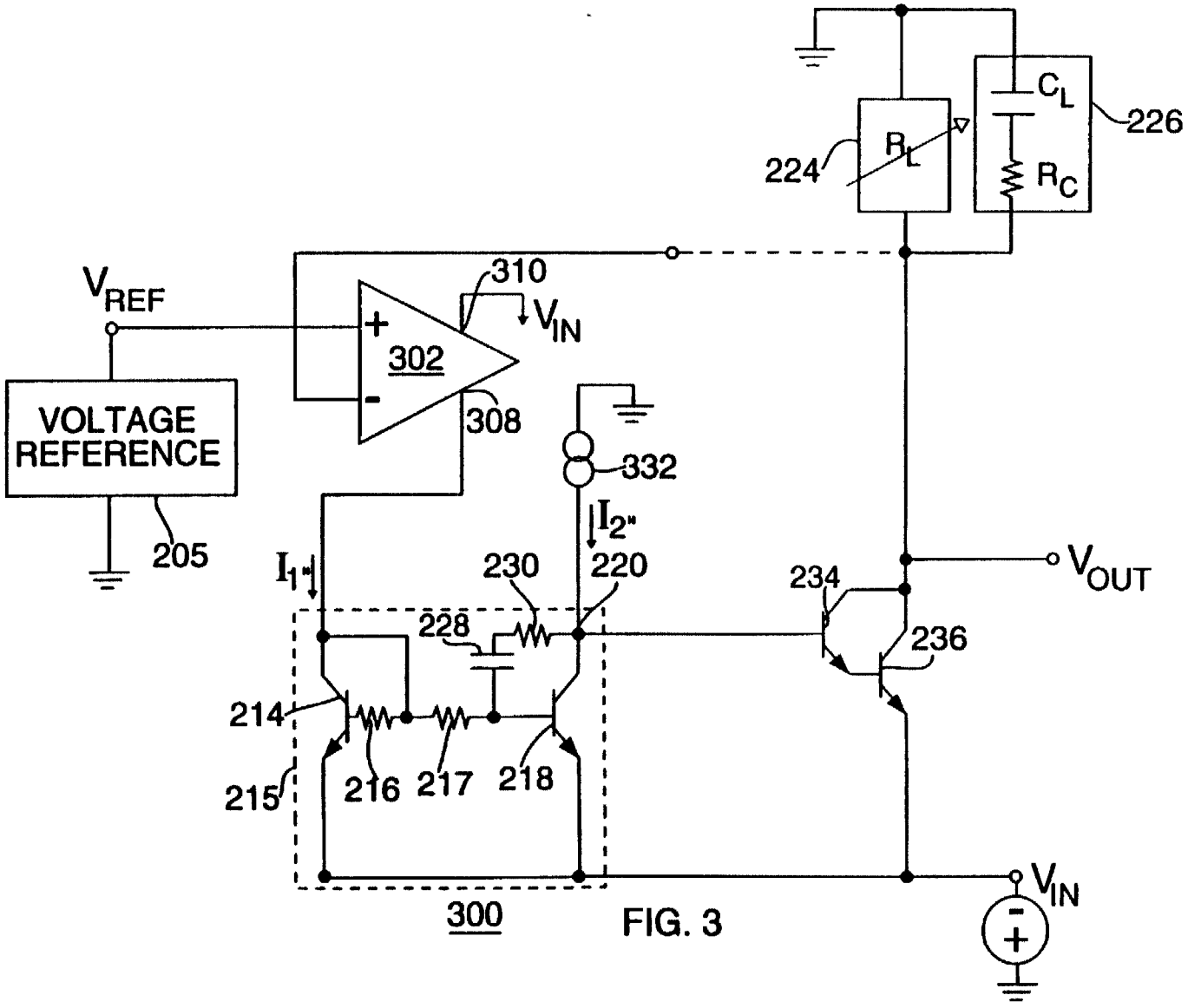
FIG. 3 is a simplified schematic of a voltage regulator circuit utilizing an alterantive embodiment of the present invention.

An alternative embodiment of the present invention is illustrated by the simplified schematic of regulator circuit 300 in FIG. 3. Regulator circuit 300 includes a conventional error amplifier 302 with differential outputs 308 and 310. In this embodiment, cancellation of the error signal in output 310 of error amplifier 302 is achieved, without the need for split collectors in the error amplifier transistors, by shunting output 310 to a point in the circuit having negligible effort on loop gain, such as terminal $V_{IN}$ (as shown in FIG. 3). Current mirror 215 is balanced by providng a dc current source 332 which conducts a non-signal current 12" to node 220. Current source 332, which can be implemented in a conventional manner, is designed such that current I2" substantially matches the non-signal component of current I1" conducted by error amplifier output 308. The remaining components of regulator circuit 300 operate as previously described with respect to FIG. 2. Likewise, optimum values for resistors 217 and 230 and capacitor 228 are chosen in accordance with the principles of the present invention already discussed. Thus, a novel frequency compensation technique for an analog circuit is provided. Persons skilled in the art will appreciate that the present invention can be practiced by other than the described embodiments, and that in actual circuits various additional components and alternative interconnections not shown in the figures may be used. For example, although negative regulator circuits are shown and described, the present invention can be implemented in positive regulators and operational amplifier circuits as well. Also, the error amplifiers of FIGS. 2 and 3 may be implemented with composite npn-pnp transistors at the inputs, as in the circuitry of the LM120, or as in the μA-741 or LM101 type operational amplifiers commercially available from various manufacturers. An error amplifier with Darlington-connected transistor pairs also could be used. The described embodiments are presented for the purposes of illustration and not of limitation, and the present invention is limited only by the claims which follow.

I claim:

1. An improved differential input amplifier stage having first and second input terminals between which a voltage difference can be generated, the stage including:

an error amplifier circuit having a differential transistor pair coupled to the first and second input terminals for generating first and second differential currents responsive to a voltage difference generated between the first and second input terminals, at least a portion of each of the first and second differential currents being respectively coupled to first and second output terminals of the error amplifier circuit;

an active load coupled to the first and second output terminals of the error amplifier for generating an error signal current at an output terminal of the input stage by subtracting from the current generated at the second error amplifier output terminal a current conducted by the active load in response to the current generated at the first error amplifier output terminal; and a frequency compensation circuit coupled to the active load to reduce the gain of the active load with respect to a range of frequencies, as a result of which the output voltage of the active load becomes less responsive to the current generated at the first error amplifier terminal at frequencies within the range of reduced gain;

wherein the improvement comprises:

means for dividing the first and second differential currents generated by the differential transistor pair into portions;

means for providing a first portion of the first differential current to the first output terminal of the error amplifier; and means for combining a second portion of the first differential current with a portion of the second differential current to generate a current at the second output terminal of the error amplifier, whereby differential signals in the current generated at the second error amplifier output terminal are substantially cancelled.

2. The improved stage of claim 1, wherein the frequency compensation circuit comprises a network of resistor and capacitor elements, and wherein gain of the stage for signal frequencies within a predetermined range can be reduced below 0.5, the predetermined range being controllable by selectably varying values of the resistor and capacitor elements.

3. The improved stage of claim 1, wherein the currents generated at the first and second error amplifier output terminals are substantially equal when no voltage difference is generated between the first and second input terminals.

4. The improved stage of claim 1, wherein the differential transistor pair of the error amplifier circuit includes first and second transistors each having a first collector and a second collector, the first collector of the first transistor being coupled to the first output terminal of the error amplifier means, the second collector of each of the first and second transistors being commonly coupled to the second output terminal of the error amplifier circuit, and the first collector of the second transistor being coupled to a shunt point in the stage.

5. The improved stage of claim 4, wherein the second collectors of the first and second transistors are of substantially equal area.

6. The imnproved stage of claim 5, wherein the first and second collectors of each of the first and second transistors have a 2:1 area ratio.

7. The improved stage of claim 1, wherein the active load means comprises a current mirror circuit.

8. The improved stage of claim 1, wherein the stage is incorporated in an integrated circuit.

9. The improved stage of claim 1, wherein the stage is incorporated in a voltage regulator circuit.

10. A differential input amplifier stage having first and second input terminals between which a voltage difference can be generated, the stage including:

a differential error amplifier circuit for generating first and second differential currents responsive to a voltage difference generated between the first and second input terminals, said second differential current being shunted;

a current source for providing a current substantially equal to a non-signal component of the first differential current;

an active load coupled to receive the first differential current and the current provided by the current source for generating an error signal current by subtracting from the current provided by the current source a current conducted by the active load in response to the first differential current; and a frequency compensation circuit coupled to the active load to reduce the gain of the active load with respect to a range of high frequencies, as a result of which the output voltage of the active load becomes less responsive to the first differential current at frequencies within the range of reduced gain.

11. In a negative voltage regulator circuit having a common-emitter output stage including an output coupled to an output of the regulator and an input, and having voltage reference circuitry for generating a reference voltage, an input amplifier stage comprising:

a differential error amplifier circuit having a first input coupled to receive the reference voltage and a second input coupled to receive a feedback signal responsive to the output of the regulator, said differential error amplifier operating to compare the reference voltage to a portion of the feedback signal to generate first and second differential currents;

an active load coupled to receive the first differential current and a second current substantially equal to a non-signal component of the first differential current for generating an error signal by subtracting the first differential current from the second current, at least a portion of the error signal being coupled to the input of the common-emitter output stage to control the output of the voltage regulator; and a frequency compensation circuit coupled to the active load to reduce the gain of the active load with respect to a range of frequencies, as a result of which the output voltage of the active load becomes less responsive to the current generated by the error amplifier circuit at frequencies within the range of reduced gain.

* * * * *